(12) United States Patent  
Collingwood et al.

(10) Patent No.: US 9,159,161 B1  
(45) Date of Patent: Oct. 13, 2015

(54) SYSTEMS AND METHODS FOR CREATING A TWO-DIMENSIONAL REPRESENTATION OF A MODEL

(75) Inventors: John Thomas Collingwood, Des Moines, WA (US); Stuart Alan Galt, Maple Valley, WA (US)

(73) Assignee: The Boeing Company, Chicago, IL (US)

( * ) Notice: Subject to any disclaimer, the term of this patent is extended or adjusted under 35 U.S.C. 154(b) by 854 days.

(21) Appl. No.: 12/891,571

(22) Filed: Sep. 27, 2010

(51) Int. Cl.
```
G09G 5/00       (2006.01)
G09G 5/02       (2006.01)
G06T 15/50      (2011.01)
G06F 17/50      (2006.01)
```
(52) U.S. Cl.
CPC .............. *G06T 15/503* (2013.01); *G06F 17/50* (2013.01)

(58) Field of Classification Search
CPC ..... G06T 15/503; G09G 2340/10; G09G 5/14
See application file for complete search history.

(56) References Cited

U.S. PATENT DOCUMENTS

| 5,745,666 | A | 4/1998 | Gilley et al. |
| 6,724,383 | B1 | 4/2004 | Herken et al. |
| 7,584,080 | B2 | 9/2009 | Taylor et al. |
| 2002/0122036 | A1* | 9/2002 | Sasaki ........................ 345/422 |

* cited by examiner

*Primary Examiner* — Stephen R Koziol  
*Assistant Examiner* — Robert Craddock  
(74) *Attorney, Agent, or Firm* — Armstrong Teasdale LLP

(57) ABSTRACT

A method of creating a two-dimensional representation of a model. The method includes receiving data corresponding to a first component and at least one second component of the model, defining a first component representation, defining the at least one second component representation, determining a visibility of the plurality of graphics of the first component representation, determining a visibility of the plurality of graphics of the at least one second component representation, defining a structure of the first component representation, defining a structure of the at least one second component representation, defining one or more display rules, and generating an illustration file.

20 Claims, 18 Drawing Sheets

SYSTEMS AND METHODS FOR CREATING A TWO-DIMENSIONAL REPRESENTATION OF A MODEL

BACKGROUND

The present disclosure relates generally to systems and methods of creating a two-dimensional representation of a model, and more specifically, to systems and methods for creating and storing a plurality of configurations (e.g., combinations of visible components) of a two-dimensional illustration in a single standard illustration file that enables a user to interactively display a selected configuration.

Conventional systems and methods of creating a two-dimensional model use lines to represent visible edges of a component. For example, as shown in FIG. 1, a two-dimensional model that includes components 102 and 104 is shown. Each component includes lines that represent edges of a cube. However, a placement and orientation of components may result in components overlapping other components. For example, as shown in FIG. 2, component 102 overlaps a portion of component 104. To preserve an appearance of each of the components, the overlapped segments of the lines from component 104 may be removed, as shown in FIG. 3. When a selected configuration does not include components that overlap other components, visible components may be missing segments of lines that represent the visible components, as shown in FIG. 4

SUMMARY

In one aspect, a method of creating a two-dimensional representation of a model that includes a first component and at least one second component is provided, wherein the two-dimensional representation includes a first component representation and at least one second component representation corresponding to the first component and the at least one second component, respectively, and wherein the first component representation and the at least one second component representation include graphics that represent edges of the first component and the at least one second component. The method includes receiving data corresponding to the first component and the at least one second component, defining the first component representation with a plurality of graphics and coordinates of the plurality of graphics that correspond to the first component, defining the at least one second component representation with a plurality of graphics and coordinates of the plurality of graphics that correspond to the at least one second component, determining a visibility of the plurality of graphics of the first component representation based on an orientation of the first component, determining a visibility of the plurality of graphics of the at least one second component representation based on an orientation of the at least one second component, defining a structure of the first component representation with respect to the plurality of graphics and coordinates of the plurality of graphics that correspond to the first component, defining a structure of the at least one second component representation with respect to the plurality of graphics and coordinates of the plurality of graphics that correspond to the at least one second component, determining an affect the at least one second component has on the visibility of the first component representation if the at least one second component and the first component representation are displayed simultaneously, defining one or more display rules, the one or more display rules configured to, based on the determined affect, utilize one or more display dependencies to control the visibility of the plurality of graphics of the first component representation when the first component representation and the at least one second component representation are displayed simultaneously, and/or store the plurality of graphics of the first component representation separately from the structure of the first component representation and the plurality of graphics of the at least one second component representation separately from the structure of the at least one second component representation, and generating an illustration file that includes the structure of the first component representation, the structure of the at least one second component representation, the plurality of graphics and the coordinates of the plurality of graphics of the first component representation, the plurality of graphics and the coordinates of the plurality of graphics of the at least one second component representation, and the one or more display rules.

In another aspect, a system for creating a two-dimensional representation of a model that includes a first component and at least one second component is provided, wherein the two-dimensional representation includes a first component representation and at least one second component representation corresponding to the first component and the at least one second component, respectively, and wherein the first component representation and the at least one second component representation include graphics that represent edges of the first component and the at least one second component. The system includes a memory area for storing the two-dimensional model and a processor. The processor is programmed to receive data corresponding to the first component and the at least one second component; define the first component representation with a plurality of graphics and coordinates of the plurality of graphics that correspond to the first component, define the at least one second component representation with a plurality of graphics and coordinates of the plurality of graphics that correspond to the at least one second component, determine a visibility of the plurality of graphics of the first component representation based on an orientation of the first component, determine a visibility of the plurality of graphics of the at least one second component representation based on an orientation of the at least one second component, define a structure of the first component representation with respect to the plurality of graphics and coordinates of the plurality of graphics that correspond to the first component, define a structure of the at least one second component representation with respect to the plurality of graphics and coordinates of the plurality of graphics that correspond to the at least one second component, determine an affect the at least one second component has on the visibility of the first component representation if the at least one second component and the first component representation are displayed simultaneously, define one or more display rules, the one or more display rules configured to, based on the determined affect, utilize one or more display dependencies to control the visibility of the plurality of graphics of the first component representation when the first component representation and the at least one second component representation are displayed simultaneously, and/or store the plurality of graphics of the first component representation separately from the structure of the first component representation and the plurality of graphics of the at least one second component representation separately from the structure of the at least one second component representation, and generate an illustration file that includes the structure of the first component representation, the structure of the at least one second component representation, the plurality of graphics and the coordinates of the plurality of graphics of the first component representation, the plurality of graphics and the coordinates of the plurality of graphics of the at least one second component representation, and the one or more display rules.

In yet another aspect, one or more computer-readable media having computer-executable modules is provided. The modules include an interface module that when executed by at least one processor causes the at least one processor to receive data corresponding to a first component and at least one second component in model; and a creation module that when executed by at least one processor causes the at least one processor to, define a first component representation with a plurality of graphics and coordinates of the plurality of graphics that correspond to the first component, define at least one second component representation with a plurality of graphics and coordinates of the plurality of graphics that correspond to the at least one second component, determine a visibility of the plurality of graphics of the first component representation based on an orientation of the first component, determine a visibility of the plurality of graphics of the at least one second component representation based on an orientation of the at least one second component, define a structure of the first component representation with respect to the plurality of graphics and coordinates of the plurality of graphics that correspond to the first component, define a structure of the at least one second component representation with respect to the plurality of graphics and coordinates of the plurality of graphics that correspond to the at least one second component, determine an affect the at least one second component has on the visibility of the first component representation if the at least one second component and the first component representation are displayed simultaneously, define one or more display rules, the one or more display rules configured to, based on the determined affect, utilize one or more display dependencies to control the visibility of the plurality of graphics of the first component representation when the first component representation and the at least one second component representation are displayed simultaneously, and/or store the plurality of graphics of the first component representation separately from the structure of the first component representation and the plurality of graphics of the at least one second component representation separately from the structure of the at least one second component representation, and generate an illustration file that includes the structure of the first component representation, the structure of the at least one second component representation, the plurality of graphics and the coordinates of the plurality of graphics of the first component representation, the plurality of graphics and the coordinates of the plurality of graphics of the at least one second component representation, and the one or more display rules.

BRIEF DESCRIPTION OF THE DRAWINGS

The present disclosure is described in detail below with reference to the attached drawing figures, wherein.

DETAILED DESCRIPTION

Configurable two-dimensional illustrations described herein provide an ability to store multiple configurations (e.g., combinations of visible components) in a single standard illustration file that a user can interactively configure to display a selected configuration. Unlike conventional two-dimensional models, the systems and methods described herein address normal loss of data due to any overlapping components. In some embodiments, as is described in further detail below, defined configurations are stored with or separately from a two-dimensional representation of a model.

Figure 1:
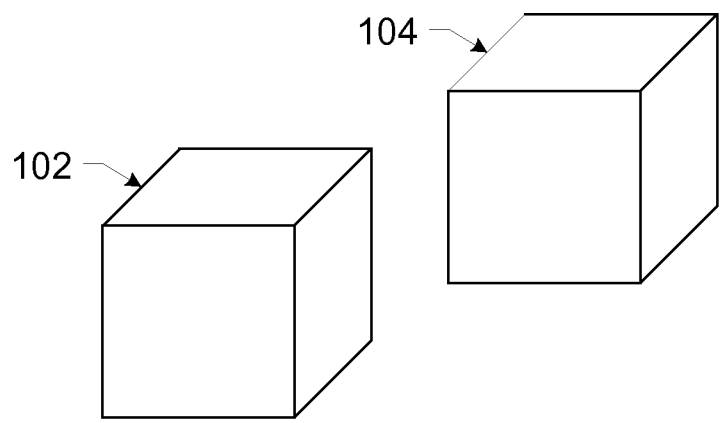
FIGS. 1-4 show conventional two-dimensional representations of a three-dimensional model.
Figure 2:
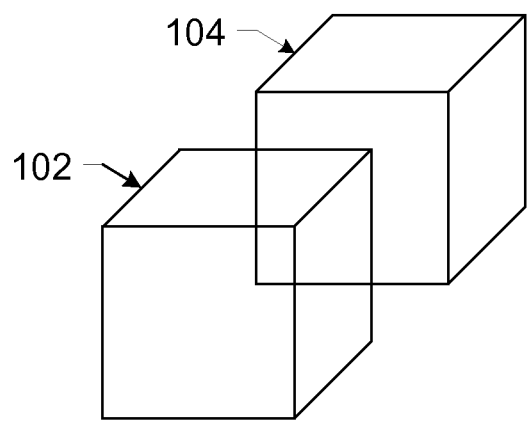
Figure 3:
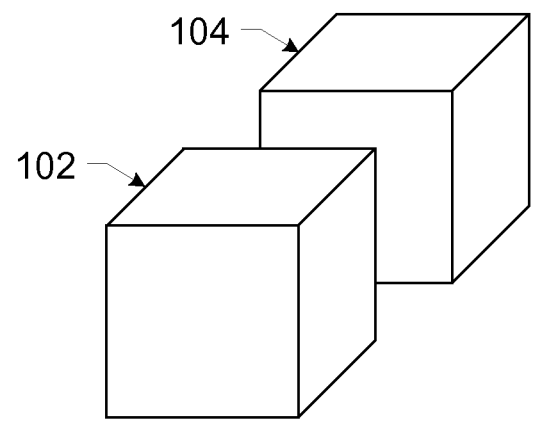
Figure 4:
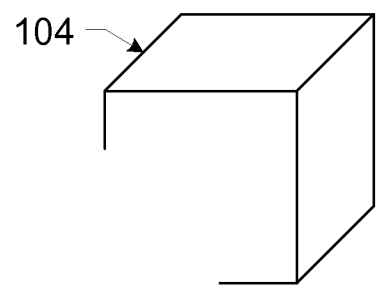
Figure 5:
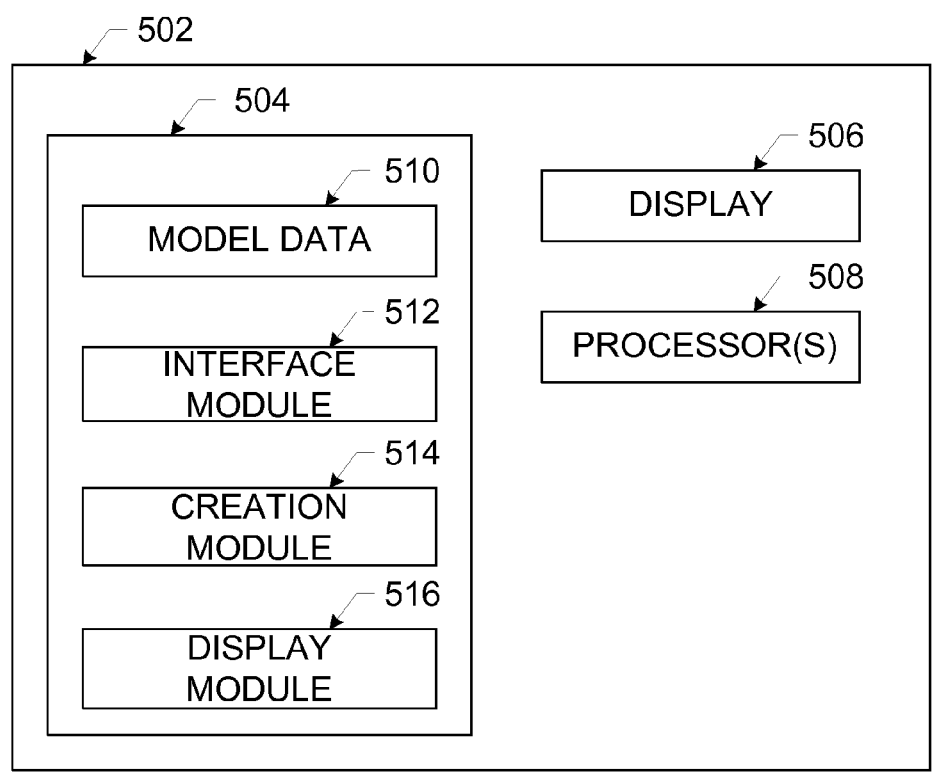
FIG. 5 is an exemplary block diagram of a computing device having a memory area storing modules for creating and displaying a two-dimensional representation of a three-dimensional model.

Referring now to FIG. 5, an exemplary block diagram illustrates a computing device 502 having, a memory area 504, a display 506, and at least one processor 508. The display 506 may be, for example, a display device separate from computing device 502, a display integrated into the computing device 502, a capacitive touch screen display, or a non-capacitive display. User input functionality may also be provided in display 506, where display 506 acts as a user input selection device such as in a touch screen.

Memory area 504 stores one or more computer-executable modules. Exemplary modules include, but are not limited to model data 510, an interface module 512, a creation module 514, and a display module 516. While the modules are shown to be stored in memory area 504, the modules may be stored and executed from a memory area remote from computing device 502. For example, data may be stored in a cloud service, a database, or other memory area accessible by computing device 502. Such embodiments reduce the computational and storage burden on computing device 502.

Processor 508 executes computer-executable instructions for implementing aspects of the present disclosure. In some embodiments, processor 508 is transformed into a special purpose microprocessor by executing computer-executable instructions or by otherwise being programmed. For example, interface module 512, when executed by processor 508, causes processor 508 to receive data corresponding to a plurality of three-dimensional components. Three-dimensional models include three-dimensional components with surfaces and edges. Thus, the data may include information corresponding to each surface and each edge that make up each three-dimensional component. Creation module 514, when executed by processor 508, causes processor 508 to define each of a plurality of representation components with a plurality of graphics and coordinates of the plurality of graphics that correspond to each of the plurality of three-dimensional components. Creation module 514 further causes processor 508 to determine a visibility of the plurality of graphics of the plurality of representation components based on an orientation of the corresponding plurality of three-dimensional components. Creation module 514 further causes processor 508 to define a structure of each of the plurality of representation components with respect to the plurality of graphics and coordinates of the plurality of graphics that correspond to respective three-dimensional components. Creation module 514 further causes processor 508 to determine an affect each of the plurality of three-dimensional components has on the visibility of each one of the plurality of representation components when one of the plurality of representation components is displayed simultaneously with each of the plurality of three-dimensional components. Based on the determined affect, one or more display dependencies can be used to control the visibility of the plurality of graphics of the plurality of representation components when the plurality of representation components is displayed simultaneously. In a further embodiment, the plurality of graphics of the plurality of representation components is stored separately from the structure of each of the plurality of representation components. Creation module 514 further causes processor 508 to generate an illustration file that includes the structure of the plurality of representation components, the plurality of graphics and the coordinates of the plurality of graphics of the plurality of representation components, and the display rules.

In one embodiment, components of a two-dimensional representation may be group in hierarchical structures. Assemblies may contain sub-assemblies and/or components. Sub-assemblies may contain other sub-assemblies and/or components. A hierarchy of components is illustrated in the following example where Assembly 1 is made of Assembly 2 and Components 3 and 4, Assembly 2 is made of Components 1 and 2, and Assembly 3 is made of components 5 and 6.

Begin Assembly 1
  Begin Assembly 2
    Component 1
    Component 2
  End Assembly 2
  Component 3
  Component 4
  End Assembly 1
  Begin Assembly 3
  Component 5
  Component 6
  End Assembly 3

A structure of a component is illustrated in the following example where a component identifier is "1" and the component contains four lines.

Begin Component 1
  Line <coordinates>
  Line <coordinates>
  Line <coordinates>
  Line <coordinates>
  End Component 1

Display module 516 causes processor 508 to display the plurality of representation components on a display device (e.g., display device 506). In one embodiment, displaying the plurality of representation components on a display device includes determining a visibility of the plurality of representation components based on a selected configuration, and setting a visibility of the plurality of graphics of the plurality of representation components based on the display rules.

Figure 6:
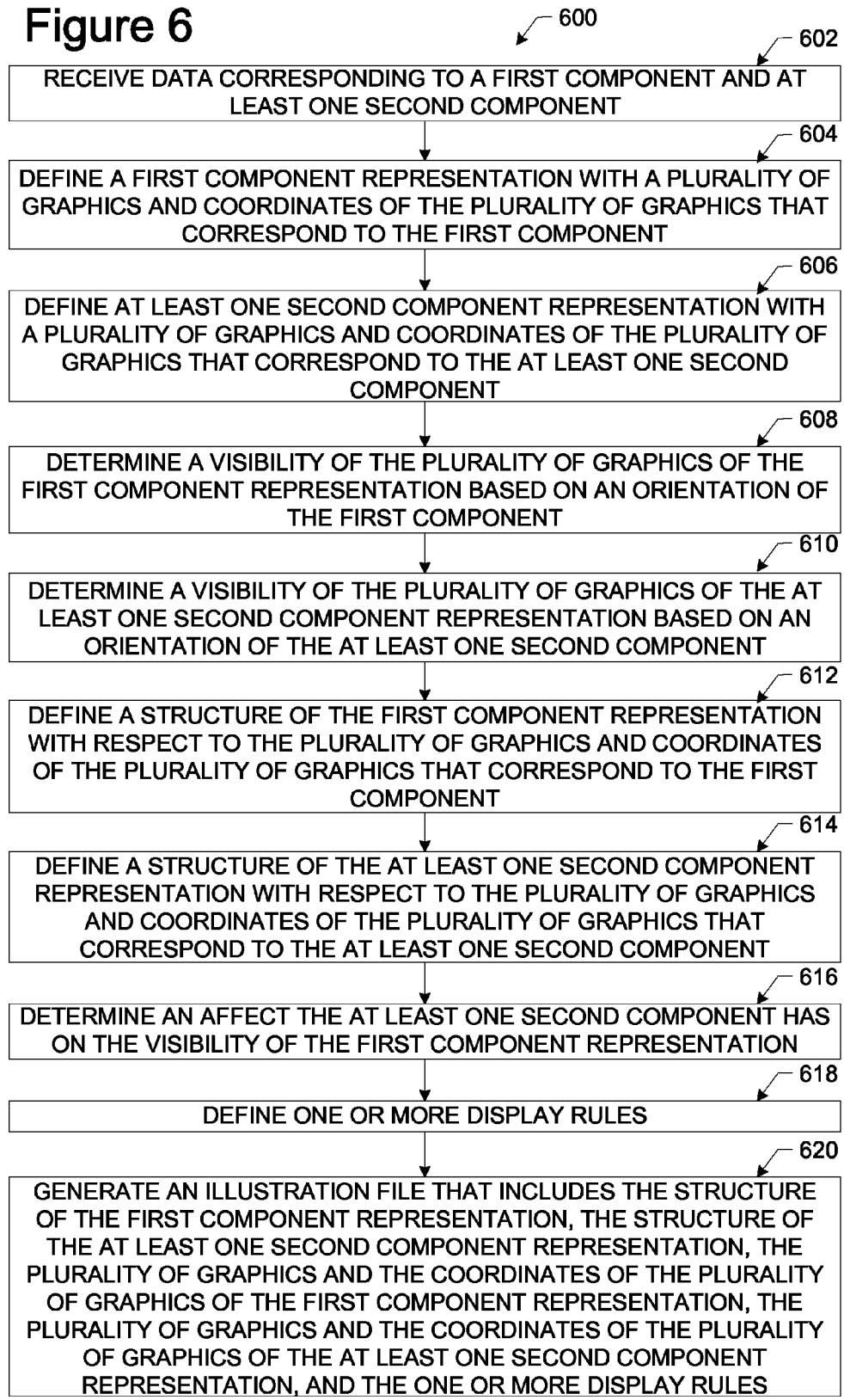
FIG. 6 is an exemplary flow chart illustrating a process for creating a two-dimensional representation of a model.

Referring next to FIG. 6, an exemplary flow chart illustrating a process 600 for creating a two-dimensional representation of a model that includes a first component and at least one second component is shown. The two-dimensional representation includes a first component representation and at least one second component representation corresponding to the first component and the at least one second component, respectively. The first component representation and the at least one second component representation include graphics that represent edges of the first component and the at least one second component.

Process 600 begins at 602 where data corresponding to the first component and the at least one second component is received. The data received may be graphical or non graphical, and the graphical data may be defined in two or more dimensions.

Figure 7:
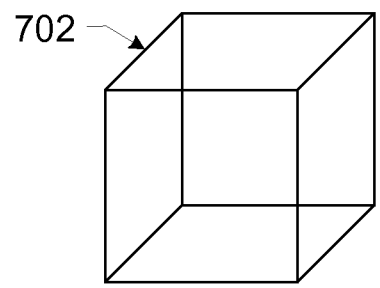
FIGS. 7-12 show exemplary two-dimensional representations of a three-dimensional model.

At 604, the first component representation is defined with a plurality of graphics and coordinates of the plurality of graphics that correspond to the first component of the model, and at 606, the at least one second component representation is defined with a plurality of graphics and coordinates of the plurality of graphics that correspond to the at least one second component. For example, with reference now to FIG. 7, a three-dimensional model that includes object 702 is shown. Twelve lines are used to illustrate edges of object 702 and coordinates of the graphics of object 702 are the end points of each of the lines.

Figure 8:
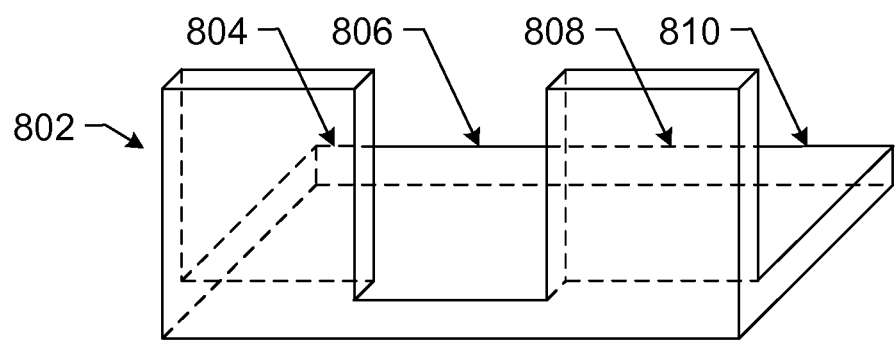

At 608, a visibility of the plurality of graphics of the first component representation is determined based on an orientation of the first component, and at 610, a visibility of the plurality of graphics of the at least one second component representation is determined based on an orientation of the at least one second component. For example, with reference to FIG. 8, based on an orientation of object 802, some lines of object 802 are visible and some lines of object 802 are not visible. The visible lines may be represented as solid lines and the not visible lines are represented as dashed lines. Further, as shown in FIG. 8, portions of a line may be visible while other portions of the same line are not visible. For example, a line represented by segments 804, 806, 808, and 810 is both visible and not visible. For example, segments 806 and 810 are visible and segments 804 and 808 are not visible. In this example, a line is divided into a plurality of lines, one line for each visible segment with coordinates being the end points of each visible segment.

Figure 9:
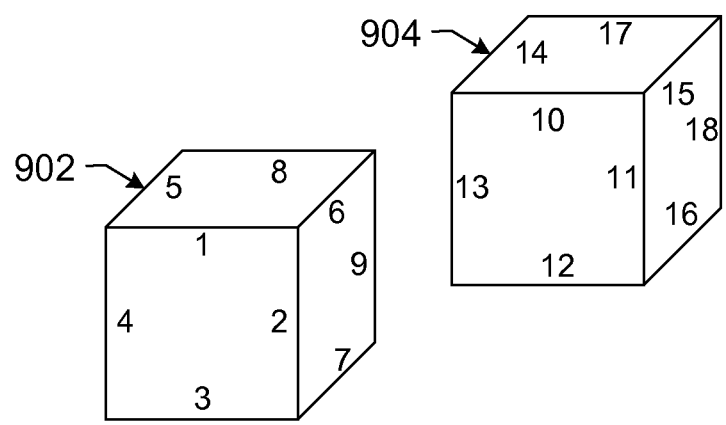

At 612, a structure of the first component representation with respect to the plurality of graphics that correspond to the first component is defined, and at 614, a structure of the at least one second component representation with respect to the plurality of graphics that correspond to the at least one second component is defined. For example, with reference to FIG. 9, a two-dimensional model that includes components 902 and 904 is shown. The structure of each of the components may be illustrated as follows:

Begin Component 902
  Line 1<coordinates>
  Line 2<coordinates>
  Line 3<coordinates>
  Line 4<coordinates>
  Line 5<coordinates>
  Line 6<coordinates>
  Line 7<coordinates>
  Line 8<coordinates>
  Line 9<coordinates>
  End Component 902
  Begin Component 904
  Line 10<coordinates>
  Line 11<coordinates>
  Line 12<coordinates>
  Line 13<coordinates>
  Line 14<coordinates>
  Line 15<coordinates>
  Line 16<coordinates>
  Line 17<coordinates>
  Line 18<coordinates>
  End Component 904

At 616, an affect the at least one second component has on the visibility of the first component representation if the at least one second component and the first component representation are displayed simultaneously is determined.

At 618, one or display rules are defined. In one embodiment, based on the determined affect, the one or more display rules are configured to utilize one or more display dependencies to control the visibility of the plurality of graphics of the first component representation when the first component representation and the at least one second component representation are displayed simultaneously. In a further embodiment, the one or more display rules are configured to store the plurality of graphics of the first component representation separately from the structure of the first component representation and the plurality of graphics of the at least one second component representation separately from the structure of the at least one second component representation.

Figure 10:
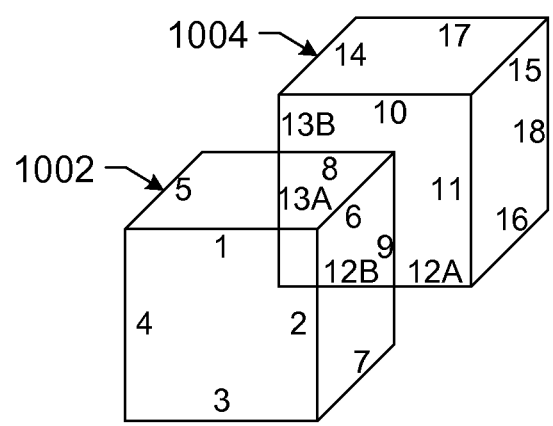

For example, as shown in FIG. 10, a two-dimensional model that includes components 1002 and 1004 is shown. Component 1004 is overlapped by component 1002. The overlap affects an appearance of lines 12 and 13. To address the conventional loss of data, line 12 is divided into lines 12A and 12B and line 13 is divided into lines 13A and 13B, where lines 12 and 13 are overlapped by component 1002. As such, display rules are defined for lines 12B and 13A. The structure and the display rules of components 1002 and 1004 are illustrated in the following example.

```
Begin Component 1002
Line 1<coordinates>
Line 2<coordinates>
Line 3<coordinates>
Line 4<coordinates>
Line 5<coordinates>
Line 6<coordinates>
Line 7<coordinates>
Line 8<coordinates>
Line 9<coordinates>
End Component 1002
Begin Component 1004
Line 10<coordinates>
Line 11<coordinates>
Line 12A <coordinates>
Line 12B <coordinates>
   depends of Component 1002
Line 13A <coordinates>
   depends of Component 1002
Line 13B <coordinates>
Line 14<coordinates>
Line 15<coordinates>
Line 16<coordinates>
Line 17<coordinates>
Line 18<coordinates>
End Component 1004
```

Figure 11:
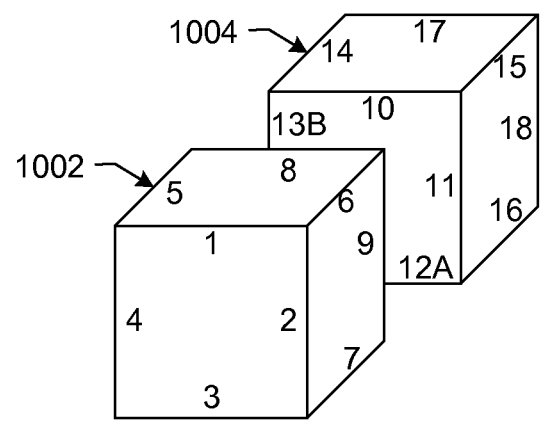
Figure 12:
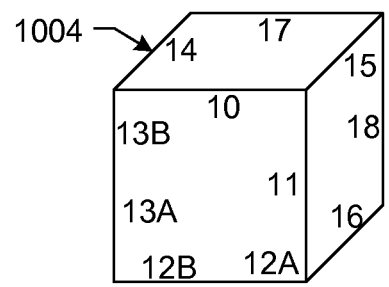

As such, when component 1002 is visible, lines 12B and 13A are not visible, as shown in FIG. 11. When component 1002 is not visible lines 12B and 13A are visible, as shown in FIG. 12.

At 620, an illustration file that includes the structure of the first component representation, the structure of the at least one second component representation, the plurality of graphics and the coordinates of the plurality of graphics of the first component representation, the plurality of graphics and the coordinates of the plurality of graphics of the at least one second component representation, and the one or more display rules is generated. The content of the illustration file is illustrated in the following example.

```
Begin Component n
Graphic of component n
   Display rules of this graphic
. . .
Graphic of component n
   Display rules of this graphic
End Component n
. . .
Begin Component n
Graphic of component n
   Display rules of this graphic
. . .
Graphic of component n
   Display rules of this graphic
End Component n
```

Figure 13:
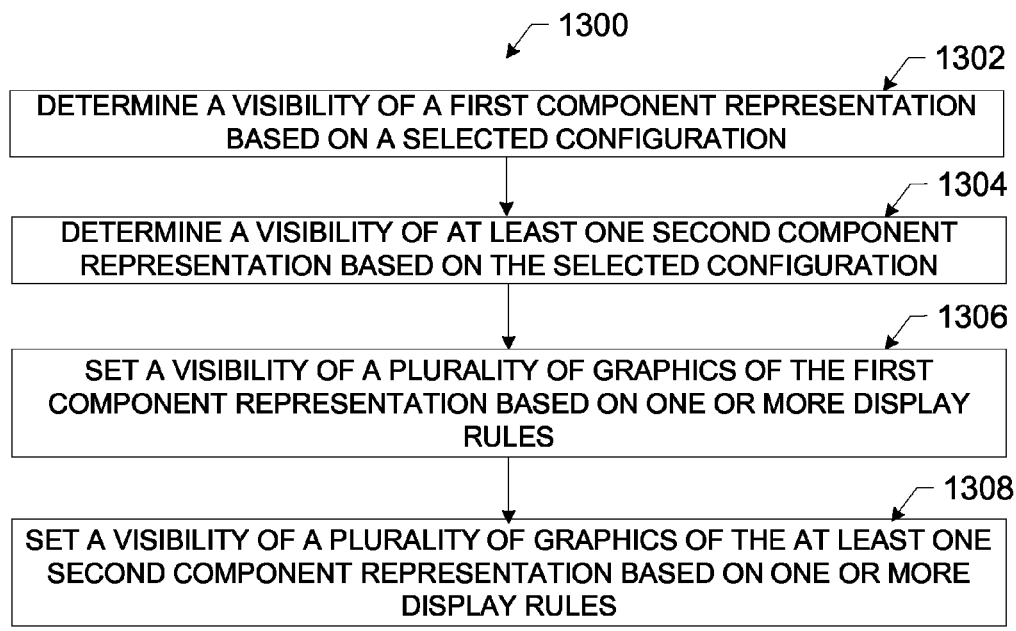
FIG. 13 is an exemplary flow chart illustrating a process for displaying a two-dimensional representation of a model.

Referring next to FIG. 13, an exemplary flow chart illustrating a process for displaying a two-dimensional representation of a model is shown. Process 1300 begins at 1302 where a visibility of the first component representation is determined based on a selected configuration, and at 1304, a visibility of the at least one second component representation is determined based on the selected configuration. At 1306, a visibility of the plurality of graphics of the first component representation is set based on the one or more display rules, and at 1308, a visibility of the plurality of graphics of the at least one second component representation is set based on the one or more display rules.

Figure 14A:
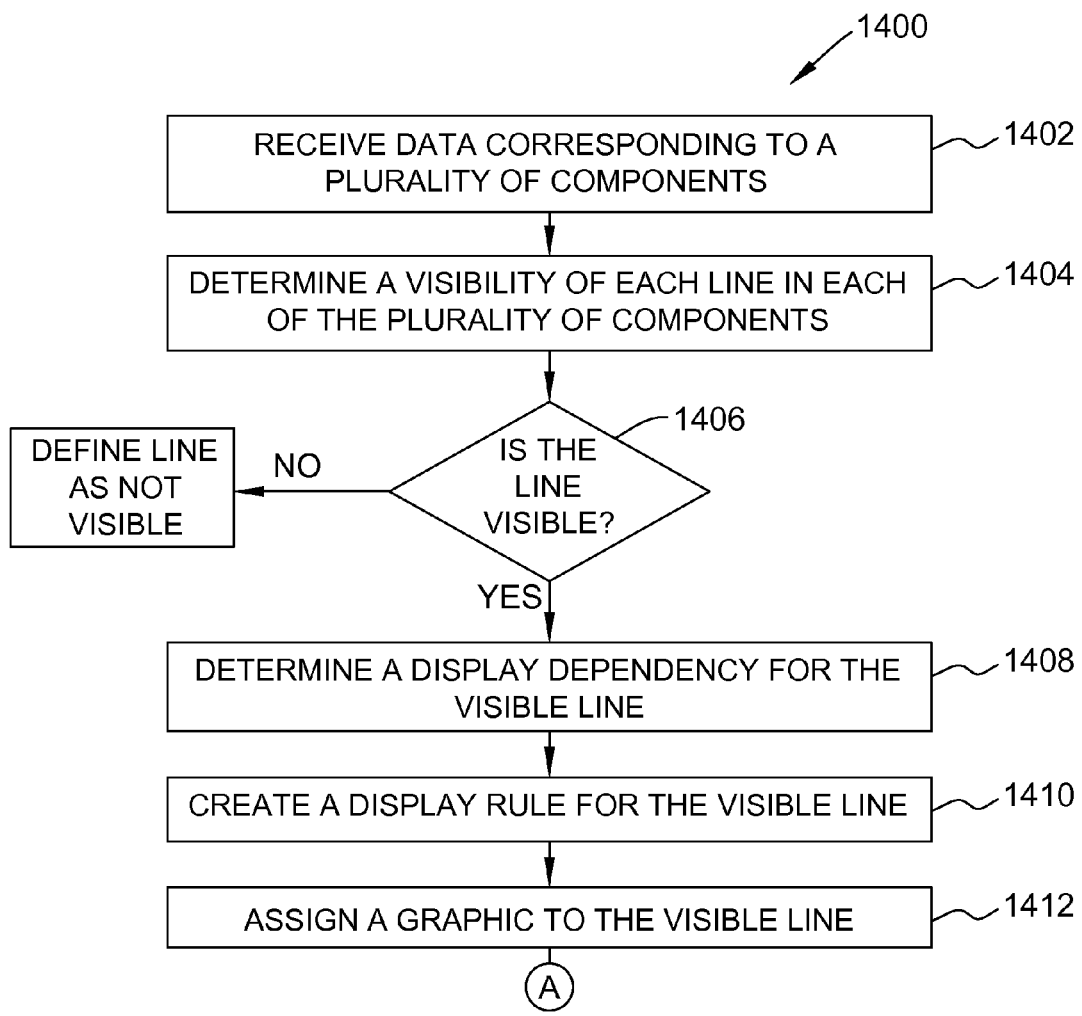
FIG. 14 is an exemplary flow chart illustrating a process for creating a two-dimensional representation of a three-dimensional model.
Figure 14B:
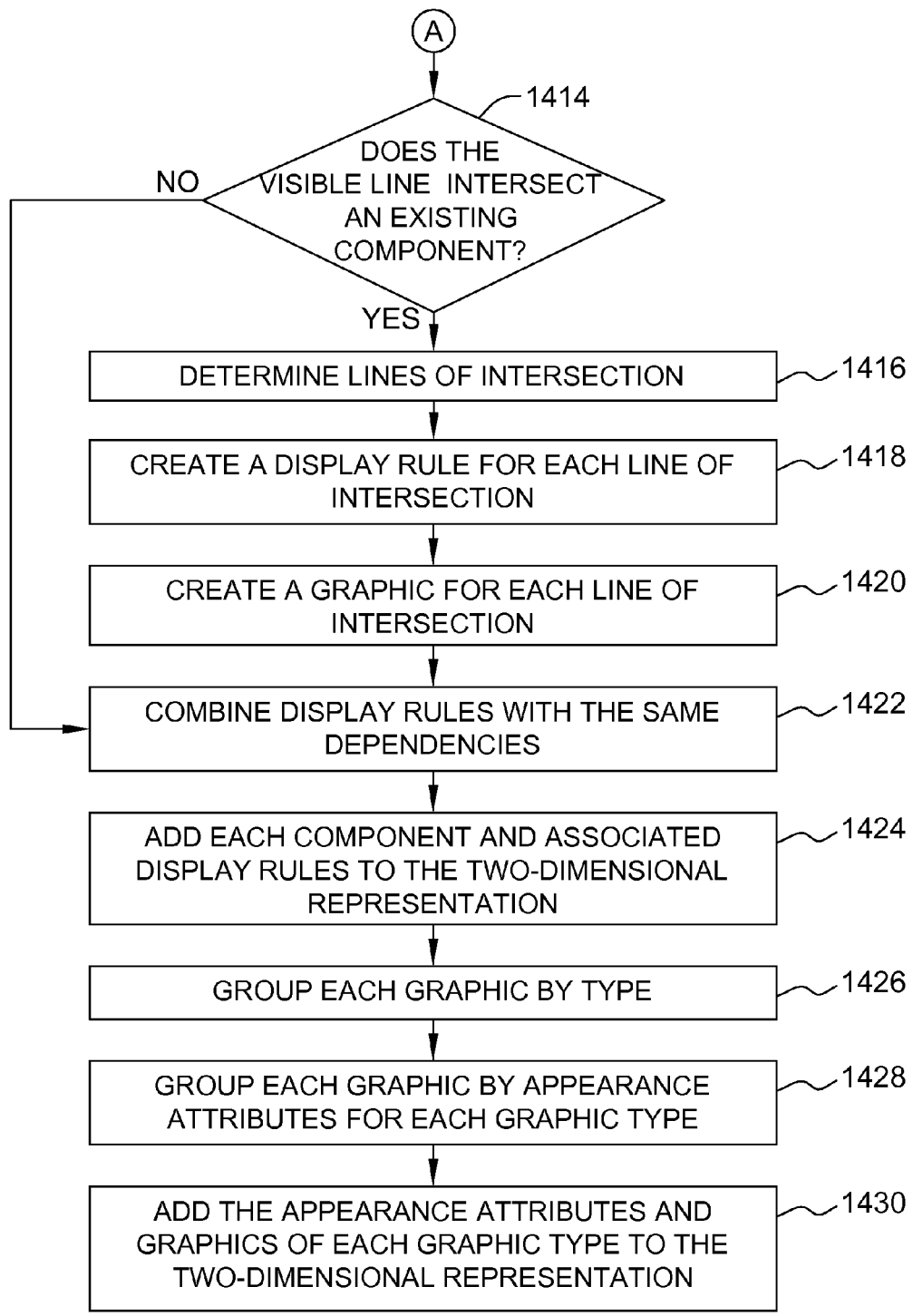

Referring next to FIG. 14, an exemplary flow chart illustrating a process 1400 for creating a two-dimensional representation of a three-dimensional model that includes a plurality of three-dimensional components is shown. Process 1400 begins at 1402 where data corresponding to a plurality of three-dimensional components is received. At 1404, for each of the plurality of components, a visibility of each line in the plurality of components is determined based on an orientation of a corresponding three-dimensional component. At 1406, if a line is determined to be visible, at 1408, a display dependency is determined based on other existing components. For example, is all of line "x" visible when component "z" is visible. If the answer is no, then a visibility of line "x" depends on an existence of component "z". At 1410, a display rule is created for each visible line.

At 1412, each visible line is assigned a graphic. At 1414, if a visible line is determined to intersect a component, lines of intersection are determined at 1416. At 1418, a display rule is created for each line of intersection. At 1420, a graphic is created for each line of intersection. At 1422, display rules with the same dependencies are combined. At 1424, each of the components and display rules associated with each of the components are added to the two-dimensional representation. At 1426, each graphic is grouped by type (e.g., hidden and centerline), and at 1428, for each graphic type, the graphics are grouped by appearance attributes (e.g., line type and lined width). At 1430, the appearance attributes and graphics of each graphic type are added to the two-dimensional representation.

Figure 15:
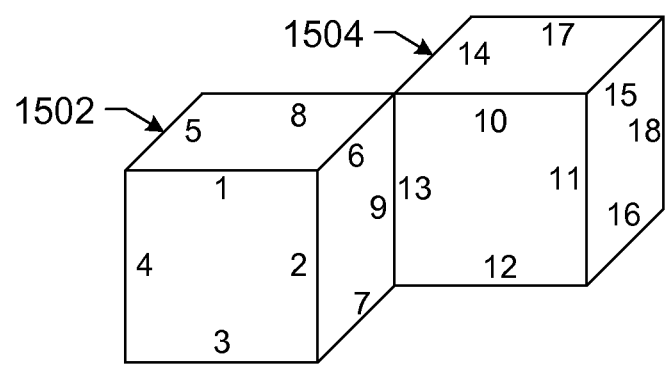
FIG. 15 shows an exemplary two-dimensional representation of a three-dimensional model.

In addition to linking graphics to components in a structure using display rules, separating graphics from a structure also enables graphics to be reused and/or shared thus reducing a size of an illustration file. In one embodiment, a reused graphic is linked to more than one component. However, the reused graphic is only "active" for one component (e.g., when a line of a component is in front of another line of a component). A shared graphic is linked to more than one component but is "active" for two or more components (e.g., components that are side by side and share a common line). For example, with reference to FIG. 15, a display rule for component 1502 line 9 and a display rule for component 1504 line 13 would link to the same line.

By separating the graphics from the structure, graphics can be grouped by type (e.g., hidden and centerline) and by appearance attributes (e.g., line type and lined width), as mentioned above with respect to FIG. 14. Grouping graphics by their types enables an ability to control a visibility of a graphic type as a set (e.g., turn all centerlines "off"). Grouping graphics by their appearance attributes reduces a number of times that an appearance attribute is specified, and as result, a smaller illustration file can be achieved. In addition, combining display rules with the same dependencies also results in a smaller illustration file based on the displayed configuration. An example of how a graphic section may be defined is shown below:

<appearance attributes>
    Begin "<type>"
    Line 1<coordinates>
    Line 2<coordinates>
    .
    .
    .
    Line n<coordinates>
    End "<type>"
    <appearance attributes>
    Begin "<type>"
    Line n<coordinates>
    .
    .
    .
    Line n<coordinates>
    End "<type>"

Once a creation of a two dimensional representation is completed, the two-dimensional representation is stored as an illustration file. In one embodiment, an illustration file includes two sections, a structure section and a graphics section. As mentioned above, the structure section includes a hierarchy as well as components in an illustration (e.g., two-dimensional representation), and the graphics section includes graphics of the illustration.

In one embodiment, the structure section includes three types of objects: assembly, component, and display rule. An assembly object may include anywhere from zero to a plurality of assembly objects and anywhere from zero to a plurality of component objects. A display rule may also be used to specify a component property.

In a further embodiment, the graphics section includes appearance attributes and graphic objects. The graphic objects may be grouped by their type (e.g., hidden, centerline, and the like) and by their appearance attributes (e.g., type, width, and the like). An example of a structure section and a graphics section in an illustration file is provided below:

STRUCTURE
      Begin "<assembly>"
        Begin "<assembly>"
          Begin "<component>"
            <display rules>
          End "<component>"
        End "<assembly>"
        Begin "<component>"
          <display rules>
        End "<component>"
      End "<assembly>"
      Begin "<component>"
        <display rules>

-continued

End "<component>"
    GRAPHICS
      <appearance attributes>
      Begin "<type>"
        Line 1 <coordinates>
        .
        .
        .
        Line n <coordinates>
      End "<type>"
      <appearance attributes>
      Begin "<type>"
        Line n <coordinates>
        .
        .
        .
        Line n <coordinates>
      End "<type>"
      <appearance attributes>
      Line n <coordinates>
      .
      .
      .
      Line n <coordinates>
      <appearance attributes>
      Line n <coordinates>
      .
      .
      .
      Line n <coordinates>

Figure 16:
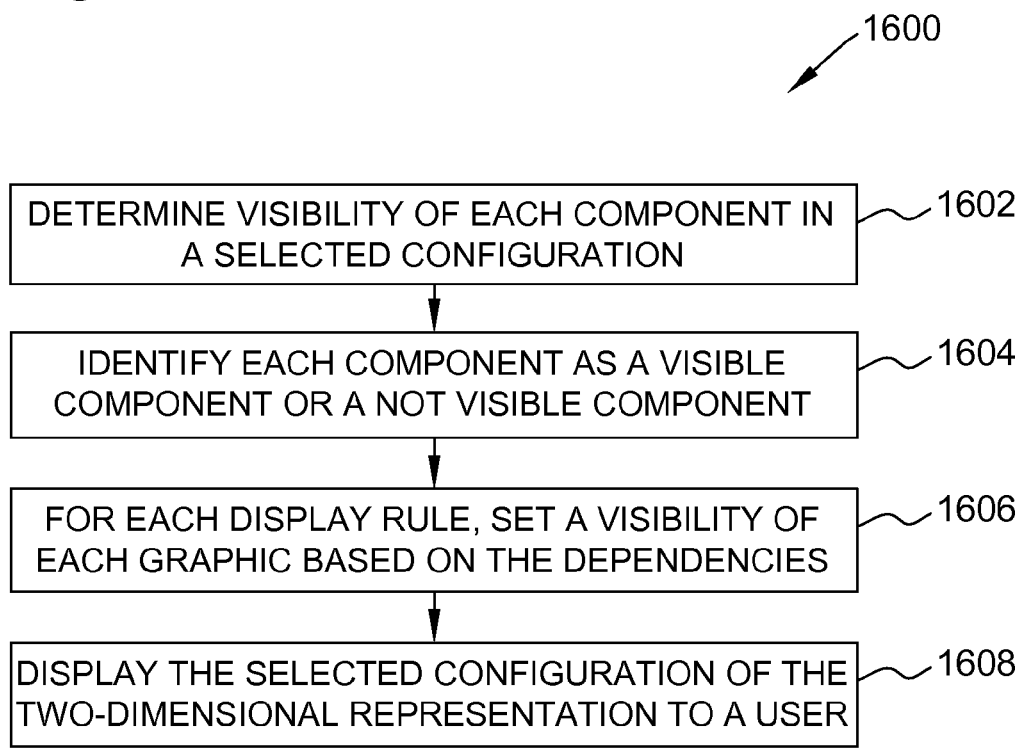
FIGS. 16 and 17 are exemplary flow charts illustrating a process for creating a two-dimensional representation of a three-dimensional model.

Referring next to FIG. 16, an exemplary flow chart illustrating a process 1600 for displaying a two-dimensional representation of a three-dimensional model is shown. Process 1600 begins at 1602 where, for each component in a two-dimensional representation, a visibility of each component in a selected configuration is determined. At 1604, each component is identified as a visible component or a not visible component in the selected configuration. At 1606, for each display rule, a visibility of each graphic is set based on dependencies. At 1608, the selected configuration is displayed to a user on, for example, display 506.

Figure 17:
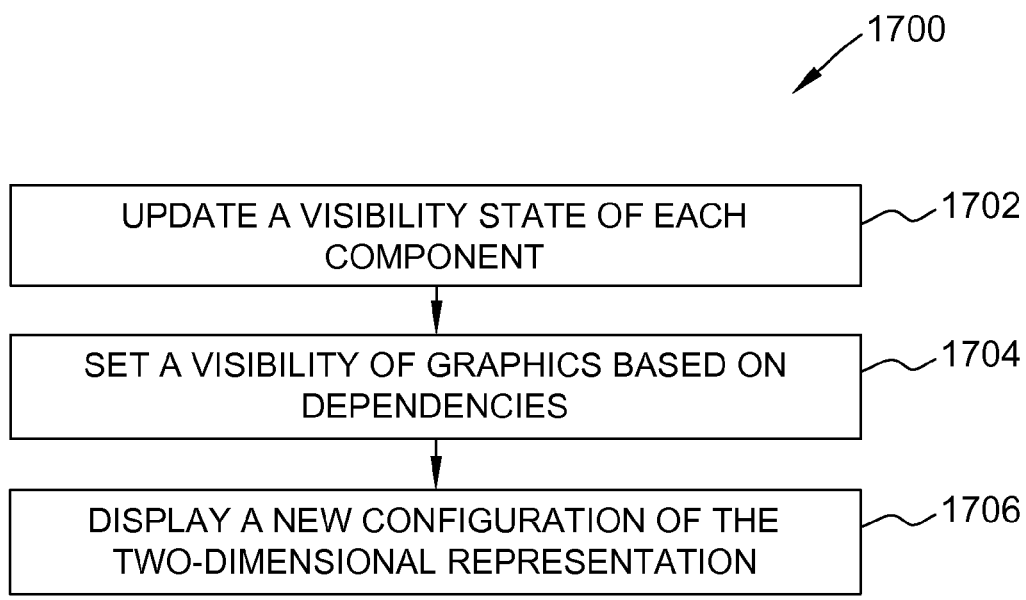

Referring next to FIG. 17, an exemplary flow chart illustrating a process 1700 for changing a visibility of components in a displayed two-dimensional representation is shown. Process 1700 begins at 1702 where a visibility state of each component is updated. At 1704, a visibility of the graphics is set based on the dependencies. At 1706, a new configuration of the two-dimensional representation is displayed to the user.

One of ordinary skill in the art guided by the teachings herein will appreciate that the processes described above are exemplary, and methods of creating and displaying a two-dimensional representation are not limited to the processes described in FIGS. 6, 13, 14, 16, and 17.

Exemplary Operating Environment

A computer or computing device such as described herein has one or more processors or processing units, system memory, and some form of computer readable media. By way of example and not limitation, computer readable media comprise computer storage media and communication media. Computer storage media include volatile and nonvolatile, removable and non-removable media implemented in any method or technology for storage of information such as computer readable instructions, data structures, program modules or other data. Communication media typically embody computer readable instructions, data structures, program modules, or other data in a modulated data signal such as a carrier wave or other transport mechanism and include any information delivery media. Combinations of any of the above are also included within the scope of computer readable media.

The computer may operate in a networked environment using logical connections to one or more remote computers, such as a remote computer. Although described in connection with an exemplary computing system environment, embodiments of the disclosure are operational with numerous other general purpose or special purpose computing system environments or configurations. The computing system environment is not intended to suggest any limitation as to the scope of use or functionality of any aspect of the disclosure. Moreover, the computing system environment should not be interpreted as having any dependency or requirement relating to any one or combination of components illustrated in the exemplary operating environment. Examples of well known computing systems, environments, and/or configurations that may be suitable for use with aspects of the disclosure include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the disclosure may be described in the general context of computer-executable instructions, such as program modules, executed by one or more computers or other devices. The computer-executable instructions may be organized into one or more computer-executable components or modules. Generally, program modules include, but are not limited to, routines, programs, objects, components, and data structures that perform particular tasks or implement particular abstract data types. Aspects of the disclosure may be implemented with any number and organization of such components or modules. For example, aspects of the disclosure are not limited to the specific computer-executable instructions or the specific components or modules illustrated in the figures and described herein. Other embodiments of the disclosure may include different computer-executable instructions or components having more or less functionality than illustrated and described herein. Aspects of the disclosure may also be practiced in distributed computing environments where tasks are performed by remote processing devices that are linked through a communications network. In a distributed computing environment, program modules may be located in both local and remote computer storage media including memory storage devices.

The order of execution or performance of the operations in embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before, contemporaneously with, or after another operation is within the scope of aspects of the disclosure.

When introducing elements of aspects of the disclosure or the embodiments thereof, the articles "a," "an," "the," and "said" are intended to mean that there are one or more of the elements. The terms "comprising," "including," and "having" are intended to be inclusive and mean that there may be additional elements other than the listed elements.

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A method of creating a two-dimensional representation of a model that includes a first component and at least one second component, the method implemented by a computing device including a processor, the method comprising:
    defining, by the computing device, a first configuration of the model in which the second component overlaps a first hidden portion of the first component, wherein the first component is defined by a first plurality of two-dimensional line segments and the second component is defined by a second plurality of two-dimensional line segments;
    determining, by the computing device, a first set of hidden line segments of the first component in the first configuration, wherein the first set of hidden line segments define the first hidden portion; and
    storing, by the computing device, a first display rule not to display the first hidden line segments when the model is displayed in the first configuration.

2. A method in accordance with claim 1, further comprising:
    defining, by the computing device, a second configuration of the model in which the second component overlaps a second hidden portion of the first component, wherein the second hidden portion is different from the first hidden portion;
    determining, by the computing device, a second set of hidden line segments of the first component in the second configuration, wherein the second set of hidden line segments define the second hidden portion; and
    storing, by the computing device, a second display rule not to display the second hidden line segments when the model is displayed in the second configuration.

3. A method in accordance with claim 1, further comprising:
    determining, by the computing device, a location in a first line segment of the first component where the second component overlaps the first line segment in the first configuration;
    dividing the first line segment into a first sub-segment and a second sub-segment at the location, wherein the first sub-segment is not overlapped by the second component and the second sub-segment is overlapped by the second component; and
    including the second sub-segment in the first set of hidden line segments in association with the first configuration.

4. A method in accordance with claim 1, further comprising:
    receiving, by the computing device, data defining a plurality of three-dimensional components; and
    generating, by the computing device, the first plurality of line segments and the second plurality of line segments based on the received data.

5. A method in accordance with claim 1, further comprising:
    assigning each of the first plurality of line segments that are not included in the first set of hidden segments to corresponding graphics; and
    storing the graphics in an illustration file.

6. A method in accordance with claim 1, further comprising:
    assigning each of the first plurality of line segments and each of the second plurality of line segments to corresponding graphics;

grouping the graphics by at least one of a type and an appearance attribute; and storing the graphics in an illustration file.

7. A method in accordance with claim 1, further comprising displaying the two-dimensional representation of the model on a display device in accordance with the first display rule.

8. A method in accordance with claim 2, further comprising displaying the two-dimensional representation of the model on a display device by at least:

receiving, by the computing device, a selection of one of the first configuration and the second configuration determining, by the computing device, a first visibility of the first component based on the selected configuration;

determining, by the computing device, a second visibility of the second component based on the selected configuration; and displaying the two-dimensional representation of the model in accordance with the first visibility and the second visibility.

9. A system for creating a two-dimensional representation of a model that includes a first component and at least one second component, the system comprising:

a memory area for storing the two-dimensional representation; and a processor programmed to:

define a first configuration of the model in which the second component overlaps a first hidden portion of the first component, wherein the first component is defined by a first plurality of two-dimensional line segments and the second component is defined by a second plurality of two-dimensional line segments:

determine a first set of hidden line segments of the first component in the first configuration, wherein the first set of hidden line segments define the first hidden portion; and store a first display rule not to display the first hidden line segments when the model is displayed in the first configuration.

10. A system in accordance with claim 9, wherein said processor is further programmed to:

define a second configuration of the model in which the second component overlaps a second hidden portion of the first component, wherein the second hidden portion is different from the first hidden portion, determine a second set of hidden line segments of the first component in the second configuration, wherein the second set of hidden line segments define the second hidden portion; and store a second display rule not to display the second hidden line segments when the model is displayed in the second configuration.

11. A system in accordance with claim 10, wherein said processor is coupled to a display device and said processor is further programmed to:

receive a selection of one of the first configuration and the second configuration;

determine a first visibility of the first component based on the selected configuration;

determine a visibility of the second component based on the selected configuration; and display the two-dimensional representation of the model in accordance with the first visibility and the second visibility.

12. A system in accordance with claim 9, wherein said processor is further programmed to:

determine a location in a first line segment of the first component where the second component overlaps the first line segment in the first configuration;

divide the first line segment into a first sub-segment and a second sub-segment at the location, wherein the first sub-segment is not overlapped by the second component and the second sub-segment is overlapped by the second component; and include the second sub-segment in the first set of hidden line segments in association with the first configuration.

13. A system in accordance with claim 9, wherein said processor is further programmed to:

receive data defining a plurality of three-dimensional components; and generate the first plurality of line segments and the second plurality of line segments based on the received data.

14. A system in accordance with claim 9, wherein said processor is further programmed to:

assign each of the first plurality of line segments that are not included in the first set of hidden segments to corresponding graphics; and store the graphics in an illustration file.

15. A system in accordance with claim 9, wherein said processor is further programmed to:

assign each of the first plurality of line segments and each of the second plurality of line segments to corresponding graphics;

group the graphics by at least one of a type and an appearance attribute; and store the graphics in an illustration file.

16. A system in accordance with claim 9, wherein said processor is coupled to a display device and said processor is further programmed to display the two-dimensional representation of the model using the display device in accordance with the first display rule.

17. One or more non-transitory computer-readable media having computer-executable instructions embodied thereon, for creating a two-dimensional representation of a model that includes a first component and at least one second component, wherein when executed by a computing device, said instructions cause the computing device to:

define a first configuration of the model in which the second component overlaps a first hidden portion of the first component, wherein the first component is defined by a first plurality of two-dimensional line segments and the second component is defined by a second plurality of two-dimensional line segments;

determine a first set of hidden line segments of the first component in the first configuration, wherein the first set of hidden line segments define the first hidden portion: and store a first display rule not to display the first hidden line segments when the model is displayed in the first configuration.

18. The non-transitory computer-readable media of claim 17, wherein said computer-executable instructions additionally cause the computing device to:

define a second configuration of the model in which the second component overlaps a second hidden portion of the first component, wherein the second hidden portion is different from the first hidden portion, determine a second set of hidden line segments of the first component in the second configuration, wherein the second set of hidden line segments define the second hidden portion; and store a second display rule not to display the second hidden line segments when the model is displayed in the second configuration.

19. The non-transitory computer-readable media of claim 18, wherein said computer-executable instructions additionally cause the computing device to:
receive a selection of one of the first configuration and the second configuration;
determine a first visibility of the first component based on the selected configuration;
determine a second visibility of the at least one second component based on the selected configuration; and
display the two-dimensional representation of the model in accordance with the first visibility and the second visibility.

20. The non-transitory computer-readable media of claim 17, wherein said computer-executable instructions additionally cause the computing device to:
determine a location in a first line segment of the first component where the second component overlaps the first line segment in the first configuration;
divide the first line segment into a first sub-segment and a second sub-segment at the location, wherein the first sub-segment is not overlapped by the second component and the second sub-segment is overlapped by the second component; and
include the second sub-segment in the first set of hidden line segments in association with the first configuration.

* * * * *